(12) United States Patent
Cai et al.

(10) Patent No.: US 9,559,018 B2
(45) Date of Patent: Jan. 31, 2017

(54) DUAL CHANNEL FINFET WITH RELAXED PFET REGION

(71) Applicants: International Business Machines Corporation, Armonk, NY (US); GLOBALFOUNDRIES, Inc., Grand Cayman, KY (US); STMICROELECTRONICS, INC., Coppell, TX (US)

(72) Inventors: Xiuyu Cai, Niskayuna, NY (US); Qing Liu, Watervliet, NY (US); Ruilong Xie, Albany, NY (US); Chun-Chen Yeh, Clifton Park, NY (US)

(73) Assignees: International Business Machines Corporation, Armonk, NY (US); Globalfoundries, Inc., Grand Cayman (KY); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/252,315

(22) Filed: Aug. 31, 2016

(65) Prior Publication Data

US 2016/0372493 A1 Dec. 22, 2016

Related U.S. Application Data

(62) Division of application No. 14/670,800, filed on Mar. 27, 2015.

(51) Int. Cl.
*H01L 27/12* (2006.01)
*H01L 21/84* (2006.01)
*H01L 29/78* (2006.01)

(52) U.S. Cl.
CPC ......... *H01L 21/845* (2013.01); *H01L 29/7849* (2013.01)

(58) Field of Classification Search
CPC . H01L 21/845; H01L 27/1211; H01L 29/7849
USPC ........................................................ 257/351
See application file for complete search history.

(56) References Cited

U.S. PATENT DOCUMENTS

| 6,562,703 | B1 | 5/2003 | Maa et al. |
| 6,593,625 | B2 | 7/2003 | Christiansen et al. |
| 6,992,025 | B2 | 1/2006 | Maa et al. |
| 7,198,995 | B2 | 4/2007 | Chidambarrao et al. |
| 7,307,273 | B2 | 12/2007 | Currie |

(Continued)

OTHER PUBLICATIONS

Appendix P—List of IBM Patents or Patent Applications Treated as Related, filed Aug. 31, 2016, 2 Pages.

(Continued)

*Primary Examiner* — Matthew Gordon
(74) *Attorney, Agent, or Firm* — Nicholas L. Cadmus (57) ABSTRACT

Fabricating a semiconductor device includes providing a strained semiconductor material (SSM) layer disposed on a dielectric layer, forming a first plurality of fins on the SSOI structure, at least one fin of the first plurality of fins is in a nFET region and at least one fin is in a pFET region, etching portions of the dielectric layer under portions of the SSM layer of the at least one fin in the pFET region, filling areas cleared by the etching, forming a second plurality of fins from the at least one fin in the nFET region such that each fin comprises a portion of the SSM layer disposed on the dielectric layer, and forming a third plurality of fins from the at least one fin in the pFET region such that each fin comprises a portion of the SSM layer disposed on a flowable oxide.

16 Claims, 4 Drawing Sheets

(56) References Cited

U.S. PATENT DOCUMENTS

| | | |
|---|---|---|
| 7,390,725 B2 | 6/2008 | Maa et al. |
| 7,494,902 B2 | 2/2009 | Jurczak et al. |
| 7,525,154 B2 | 4/2009 | Nagano et al. |
| 7,525,161 B2 | 4/2009 | Ieong et al. |
| 8,106,381 B2 | 1/2012 | Atanackovic |
| 8,735,869 B2 | 5/2014 | Cappellani et al. |
| 8,895,381 B1 | 11/2014 | Cheng et al. |
| 2012/0080722 A1 | 4/2012 | Yin et al. |
| 2013/0200468 A1 | 8/2013 | Cai et al. |

OTHER PUBLICATIONS

Cai et al., "Dual Channel finFET with Relaxed pFET Region", U.S. Appl. No. 14/670,800, filed Mar. 27, 2015, 22 pages.

DUAL CHANNEL FINFET WITH RELAXED PFET REGION

BACKGROUND OF THE INVENTION

The present invention relates generally to semiconductor devices, and more particularly to utilizing strained silicon-on-insulator (SSOI) substrates for nFET regions with strain release in pFET regions.

A complementary metal oxide semiconductor device (CMOS) uses complementary and symmetrically-oriented pairs of p-type and n-type metal oxide semiconductor field effect transistors (MOSFETs) arranged on silicon or silicon on insulator (SOI) substrates. A MOSFET, which is used for amplifying or switching electronic signals for logic functions, has source and drain regions connected by a channel. The source region is a terminal through which current in the form of majority charge carriers electrons or holes enters the channel, and the drain region is a terminal through which current in the form of majority charge carriers leaves the channel. In a p-type MOSFET (hereinafter "pFET"), the majority charge carriers are holes that flow through the channel, and in an n-type MOSFET (hereinafter "nFET"), the majority charge carriers are electrons that flow through the channel. A gate overlies the channel and controls the flow of current between the source and drain regions. The channel may be defined by a thin "fin" that provides more than one surface through which the gate controls the flow of current, thereby making the pFETs and nFETs "finFET" devices. Generally, the length of the fin is several orders of magnitude greater than the width.

Substrates used in the fabrication of pFETs and nFETs may comprise strained silicon on insulator (SSOI) substrates. Such substrates generally have intrinsic tensile stresses of several giga-Pascals (GPa), which generally improves electron mobility, thereby improving device performance. The strain in these substrates allows for improvement in device performance without a degradation in electrostatic characteristics even in short-channel finFET devices where the length and the width of the channel is short compared to those of typical planar MOSFETs. The channel length in finFET devices can be reduced compared to planar MOSFETs because of its improved gate control but the width can be the same.

SUMMARY

Embodiments of the present invention disclose, a method for fabricating a semiconductor device, including providing a strained silicon on insulator (SSOI) structure, wherein the SSOI structure comprises at least a substrate, a dielectric layer disposed on the substrate, and a strained semiconductor material layer disposed on the dielectric layer. The method further includes forming a first plurality of fins, on the SSOI structure by etching the strained semiconductor material layer down into the dielectric layer, wherein at least one fin of the first plurality of fins is in a nFET region of the SSOI structure and at least one fin of the first plurality of fins is in a pFET region of the SSOI structure. The method further includes etching portions of the dielectric layer under portions of the strained semiconductor material layer of the at least one fin of the first plurality of fins in the pFET region, leaving a portion of the dielectric layer under portions of the strained semiconductor material layer of the at least one fin of the first plurality of fins in the pFET region. The method further includes filling, with a flowable oxide, areas cleared by the etching of portions of the dielectric layer under portions of the strained semiconductor material layer of the at least one fin of the first plurality of fins in the pFET region. The method further includes forming a second plurality of fins from the at least one fin of the first plurality of fins in the nFET region such that each fin of the second plurality of fins comprises a portion of the strained semiconductor material layer disposed on the dielectric layer. The method further includes forming a third plurality of fins from the at least one fin of the first plurality of fins in the pFET region such that each fin of the third plurality of fins comprises a portion of the strained semiconductor material layer disposed on the flowable oxide.

Embodiments of the present invention disclose, a semiconductor device, having a strained silicon on insulator (SSOI) structure, wherein the SSOI structure comprises at least a substrate, a dielectric layer disposed on the substrate, and a strained semiconductor material layer disposed on the dielectric layer. The semiconductor device further includes a first plurality of fins in an nFET region of the SSOI structure, wherein each fin of the first plurality of fins comprises a portion of the strained semiconductor material layer disposed on the dielectric layer. The semiconductor device further includes a second plurality of fins in a pFET region of the SSOI structure such that each fin of the second plurality of fins comprises a portion of the strained semiconductor material layer disposed on a flowable oxide.

BRIEF DESCRIPTION OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed present invention, as oriented in the drawing figures. The terms "overlying", "underlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Circuits as described herein may be part of a design for an integrated circuit chip. The chip design may be created in a graphical computer programming language, and stored in a computer readable storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Some embodiments of the present invention recognize that for finFET performance increase a strained channel material is needed. Using a strained silicon on insulator (SSOI) substrate as starting wafer will yield strained fins. The retention of the strain for SSOI is from the locking of $Si/SiO_2$ binding at the interface layer. When the global intrinsic stresses in an SSOI substrate exceed a predetermined maximum value (e.g., greater than about 1 GPa), however, the performance of pFET finFET devices may be compromised by 8 to 15%. This is a consequence of hole mobility degradation in the presence of tensile stress in the SSOI substrates. Accordingly, it is desirable to relax the tensile stress in the channels of pFET devices and to improve/restore their performance to the SOI substrate levels. If this can be achieved, nFET devices can be produced having higher performance without degrading the complementary pFET devices (hence improved overall switching speed at the circuit level). Tensile strained fins (SSOI) are beneficial for nFET devices but not for pFET devices. Therefore there is a need to release the tensile strain in the pFET fins.

Embodiments of the present invention generally provide a structure and method of formation of finFET devices on a SSOI substrate having tensile strained fins for nFET devices and relaxed fins for pFET devices. The structure can be formed by removing the $SiO_2$ below the SSOI in the pFET area to fully relax the SSOI on pFET.

The present invention will now be described in detail with reference to the Figures.

Figure 1:
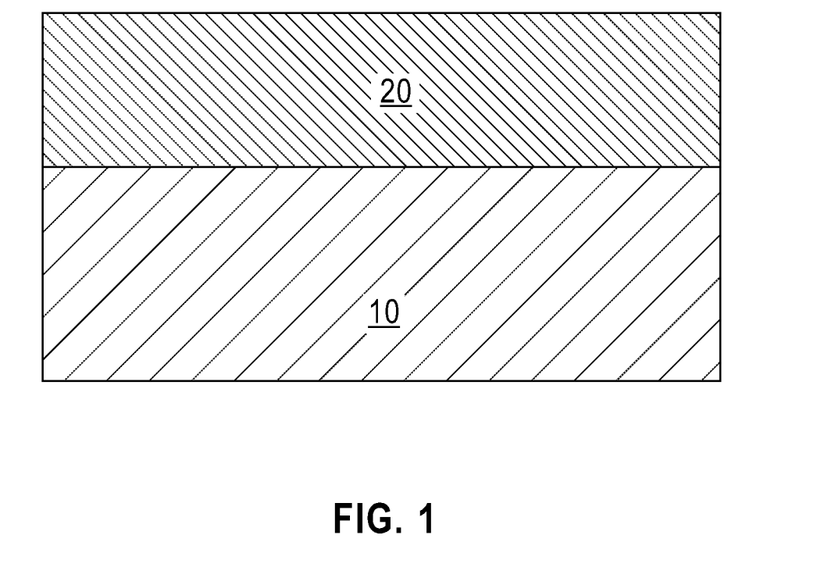
FIG. 1 depicts cross-sectional view of a strained silicon on insulator (SSOI) structure, in accordance with one embodiment of the present invention.

FIG. 1 depicts a cross-sectional view of a strained silicon on insulator (SSOI) structure, in accordance with one embodiment of the present invention. In one embodiment, the SSOI structure includes a substrate (not shown), dielectric layer 10, and strained semiconductor material layer 20 for embodiments that include a finFET structure built on an SSOI precursor.

The substrate is composed of any conventional semiconductor substrate material. Conventional semiconductor substrate material includes, but is not limited to, silicon (Si), germanium (Ge), silicon germanium (SiGe), silicon carbide, type III-V compound semiconductors, type II-VI compound semiconductors, and combinations and multi-layers thereof.

Overlying the substrate is dielectric layer 10. Dielectric layer 10 can comprise a buried oxide (BOX) or other dielectric material. BOX material can include any conventional oxide material, e.g., silicon dioxide ($SiO_2$). Dielectric layer 10 has a typical thickness of about 50 nm to about 500 nm. Dielectric layer 10 can be formed by thermally oxidizing the exposed surface of the substrate, or can be deposited onto the substrate using, for example, chemical vapor deposition (CVD) or atomic layer deposition (ALD). As used herein, and unless otherwise noted, the term "depositing" can include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Overlying dielectric layer 10 is strained semiconductor material layer 20. Strained semiconductor material layer 20 can include silicon, silicon germanium, or any suitable semiconductor material. In one embodiment, strained semiconductor material layer 20 comprises an epitaxially grown biaxially tensile strained Si-containing material. Strained semiconductor material layer 20 can be grown to a thickness that is less than its critical thickness. Typically, strained semiconductor material layer 20 can be grown to a thickness ranging from about 50 nm to about 100 nm. In one embodiment, in between strained semiconductor material layer 20 and dielectric material layer 10 is an interface layer. The retention of the strain for the strained semiconductor material layer 20 is from the locking of strained semiconductor material and dielectric material binding at the interface layer.

Figure 2:
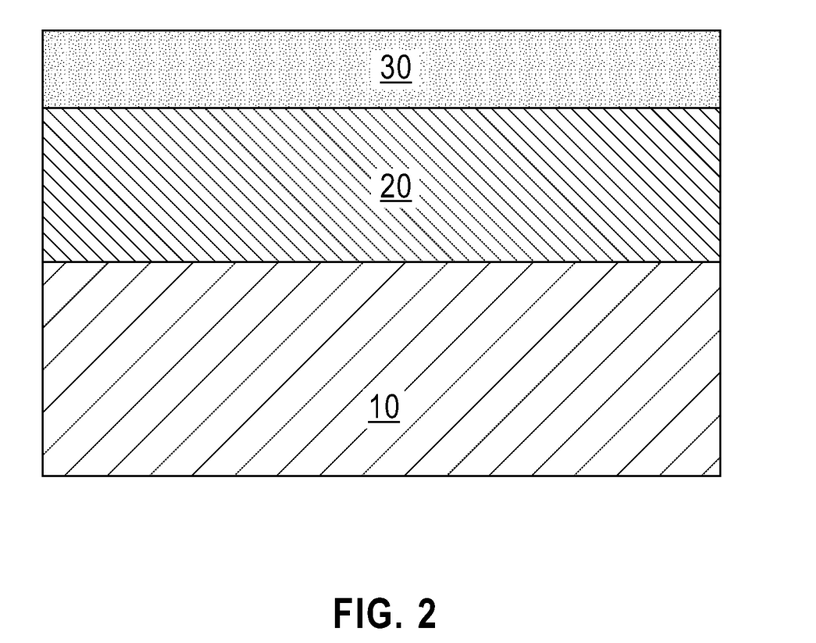
FIG. 2 depicts a cross-sectional view of the strained silicon on insulator (SSOI) structure of FIG. 1 after the deposition of a hard mask layer, in accordance with one embodiment of the present invention.

FIG. 2 depicts a cross-sectional view of the strained silicon on insulator (SSOI) structure of FIG. 1 after the deposition of hard mask layer 30, in accordance with one embodiment of the present invention.

Hard mask layer 30 is used to protect areas of strained semiconductor material layer 20 during subsequent etching. In one embodiment, hard mask layer 30 is a nitride deposited using, for example, low pressure chemical vapor deposition (LPCVD). For example, hard mask layer 30 may be silicon nitride (SiN) with a typical thickness of about 10 nm. In other embodiments, hard mask layer 30 can be any hard mask material that can act as an etch mask during subsequent etching. For example, hard mask layer 30 may be, but is not limited to, hafnium oxide ($HfO_2$) or titanium oxide. In general, hard mask layer 30 is of a sufficient thickness to prevent the removal of portions of strained semiconductor material layer 20 located underneath hard mask layer 30.

Figure 3:
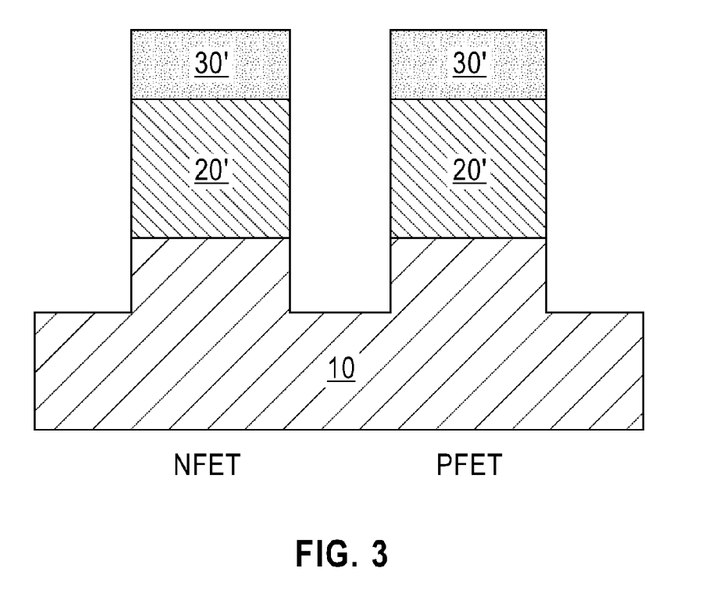
FIG. 3 depicts a cross-sectional view of the structure of FIG. 2 after the patterning of the hard mask layer and subsequent etching into the dielectric layer, in accordance with one embodiment of the present invention.

FIG. 3 depicts a cross-sectional view of the structure of FIG. 2 after the patterning of hard mask layer 30 and subsequent etching into dielectric layer 10, in accordance with one embodiment of the present invention.

In one embodiment, a blanket layer of resist material (not shown), an imageable layer, can be deposited on hard mask layer 30 of FIG. 2 and is used as a mask to define a pattern in hard mask layer 30. The blanket layer of resist material is then lithographically patterned into a predetermined shape forming a patterned resist layer. Lithographic patterning of the blanket layer of resist material may include optical lithography. Lithographic patterning of the blanket layer of resist material may also include electron beam lithography, such as, for example, direct write electron beam lithography.

After lithographically patterning the blanket layer of resist material forming a patterned resist layer, the pattern within the patterned resist layer can be transferred to hard mask layer 30 forming patterned hard mask layer 30'. The remaining portions of hard mask layer 30 which are not removed during this step are designated in the drawings as patterned hard mask layer 30'. In one embodiment, the transfer of the pattern from the patterned resist layer to hard mask layer 30 includes an anisotropic dry etching process such as, for example, reactive ion etching, plasma etching, or ion beam etching. The patterned resist layer can be removed in some embodiments. The removal of the patterned resist layer can be achieved utilizing any conventional process that is capable of removing a resist material from a structure. In one embodiment, the patterned resist layer can be removed by an ashing process.

After removing the patterned resist layer and the remaining portions of hard mask layer 30, patterned hard mask layer 30', can be used, with or without the remaining portions of the patterned resist layer, to etch through strained semiconductor material layer 20 into dielectric layer 10 forming a plurality of fins. Strained semiconductor material layer 20 and dielectric layer 10 can be etched using a dry etch technique (e.g., plasma dry etching such as reactive ion etching (RIE) or the like or a non-plasma etching technique using, for example, fluorine-containing gas). In one embodiment, the etching process may stop about 30 nm down into dielectric layer 10. In other embodiments, the etching process may stop anywhere from 30 nm to 50 nm down into dielectric layer 10. The remaining portions of strained semiconductor material layer 20 which are not removed during this step are designated in the drawings as patterned strained semiconductor material layer 20'. In one embodiment, each portion of patterned strained semiconductor material layer 20' may be anywhere from 50 nm to 80 nm in width.

Depicted in FIG. 3 are an nFET region on the left and a pFET region on the right. The nFET and pFET regions receive different processing in the subsequent steps.

Figure 4:
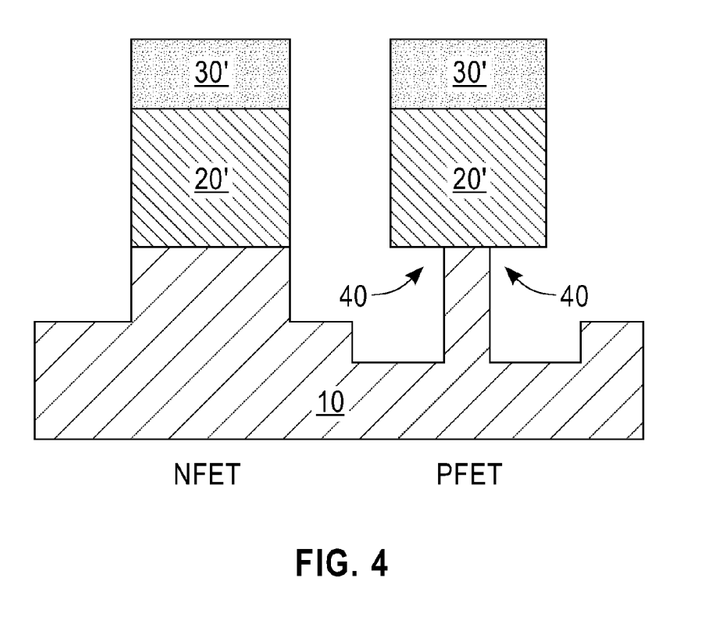
FIG. 4 depicts a cross-sectional view of the structure of FIG. 3 after the lateral etching into the dielectric layer under portions of the patterned strained semiconductor material layer in the pFET region, in accordance with one embodiment of the present invention.

FIG. 4 depicts a cross-sectional view of the structure of FIG. 3 after the lateral etching into dielectric layer 10 under portions of patterned strained semiconductor material layer 20' in the pFET region, in accordance with one embodiment of the present invention.

In one embodiment, a blanket hard mark layer (not shown) is deposited over the structure of FIG. 3. The hard mask layer here is used to protect portions of dielectric layer 10 in nFET regions during the lateral etch into dielectric layer 10 under portions of patterned strained semiconductor material layer 20' in pFET regions. In one embodiment, the hard mask layer is a nitride deposited using, for example, low pressure chemical vapor deposition (LPCVD). For example, the hard mask layer may be silicon nitride (SiN) with a typical thickness of about 10 nm. In other embodiments, the hard mask layer can be any hard mask material that can act as an etch mask during subsequent lateral etching. For example, the hard mask layer may be, but is not limited to, hafnium oxide ($HfO_2$) or titanium oxide. In general, the hard mask layer is of a sufficient thickness to prevent the removal of portions of dielectric layer 10 in nFET regions.

In one embodiment, a blanket layer of resist material (not shown), an imageable layer, can be deposited on the hard mask and is used as a mask to define a pattern in the hard mask layer. The blanket layer of resist material is then lithographically patterned into a predetermined shape forming a patterned resist layer. Lithographic patterning of the blanket layer of resist material may include optical lithography. Lithographic patterning of the blanket layer of resist material may also include electron beam lithography, such as, for example, direct write electron beam lithography.

After lithographically patterning the blanket layer of resist material forming a patterned resist layer, the pattern within the patterned resist layer can be transferred to the hard mask layer forming a patterned hard mask layer. Here the patterned hard mask layer protects portions of dielectric layer 10 in nFET regions and leaves exposed portions of dielectric layer 10 under portions of patterned strained semiconductor material layer 20' in pFET regions. In one embodiment, the transfer of the pattern from the patterned resist layer to the hard mask layer includes an anisotropic dry etching process such as, for example, reactive ion etching, plasma etching, or ion beam etching. The patterned resist layer can be removed in some embodiments. The removal of the patterned resist layer can be achieved utilizing any conventional process that is capable of removing a resist material from a structure. In one embodiment, the patterned resist layer can be removed by an ashing process.

After removing the patterned resist layer, the remaining portions of the patterned hard mask layer can be used, with or without the remaining portions of the patterned resist layer, to etch into portions of dielectric layer 10 under patterned strained semiconductor material layer 20' in pFET regions. In one embodiment, dielectric layer 10 can be etched using an isotropic etching technique (e.g., wet etching or chemical etching) in the areas designated as regions 40. In one embodiment, the etching process may etch laterally, portions of dielectric layer 10 under portions of patterned strained semiconductor material layer 20' in pFET regions. In one embodiment, the lateral etch of portions of dielectric layer 10 may remove 10 nm to 20 nm, preferably about 13 nm to about 15 nm, of material from each side of a portion of dielectric layer 10 under a portion of patterned strained semiconductor material layer 20'.

After the etching of dielectric layer 10, the remaining portions of the patterned hard mask layer are removed. In one embodiment, a wet etch can be used to remove the remaining portions of the patterned hard mask layer. An example of a wet etch process that can be used to remove the remaining portions of the patterned hard mask layer includes a diluted HF solution.

Figure 5:
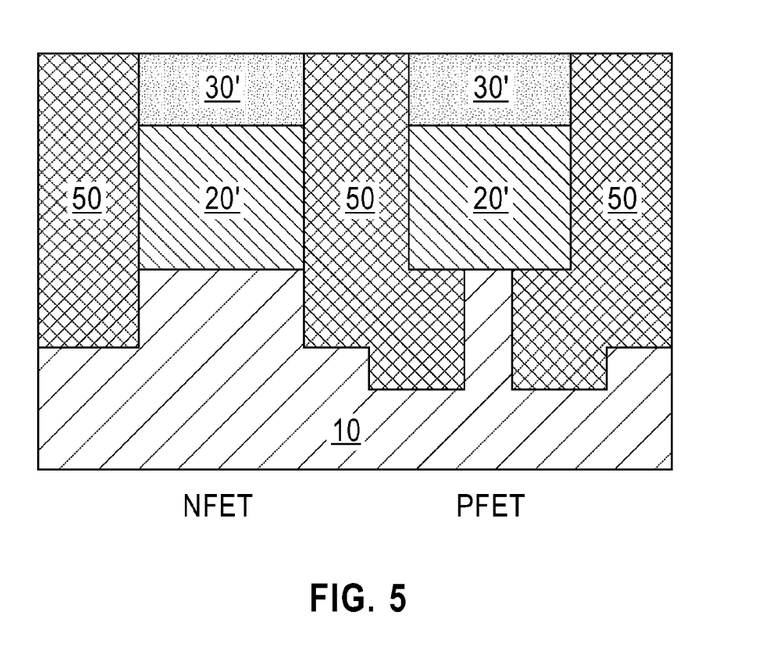
FIG. 5 depicts a cross-sectional view of the structure of FIG. 4 after trenches and the area cleared by the lateral etch of portions of the dielectric layer under portions of the patterned strained semiconductor material layer in pFET regions are filled with a flowable oxide layer, in accordance with one embodiment of the present invention.

FIG. 5 depicts a cross-sectional view of the structure of FIG. 4 after trenches and the area cleared by the lateral etch of portions of dielectric layer 10 under portions of patterned strained semiconductor material layer 20' in pFET regions are filled with flowable oxide layer 50, in accordance with one embodiment of the present invention.

In one embodiment, flowable oxide layer 50 is disposed in the trenches between stacks of material, such as, patterned hard mask layer 30' disposed over patterned strained semiconductor material layer 20' disposed over dielectric layer 10 (as shown in FIG. 5). Flowable oxide layer 50 also fills the area cleared by the lateral etch of portions of dielectric layer 10 under portions of patterned strained semiconductor material layer 20' in pFET regions. In one embodiment, flowable oxide layer 50 can be any type of flowable oxide (e.g., $SiO_2$) that is capable of filling the trenches between stacks of material and filling the area cleared by the lateral etch of portions of dielectric layer 10 under portions of patterned strained semiconductor material layer 20' in pFET regions. Flowable oxide layer 50 can be formed utilizing a deposition process such as, for example, chemical vapor deposition (CVD), plasma enhanced chemical vapor deposition (PECVD), evaporation, chemical solution deposition and spin-on coating.

In some embodiments, flowable oxide layer 50 is deposited to a height above an uppermost surface of patterned hard mask layer 30'. A planarization process is employed in forming the structure shown in FIG. 5. The planarization process results in a structure in which flowable oxide layer 50 has an uppermost surface that is substantially coplanar with the uppermost surface of patterned hard mask layer 30'.

In one embodiment, the planarization process includes chemical mechanical polishing and/or grinding. In other embodiments, an etch back process can be used to provide the structure shown in FIG. 5. In yet another embodiment, the planarization process includes chemical mechanical polishing and/or grinding and an etch back process to provide the structure shown in FIG. 5.

Figure 6:
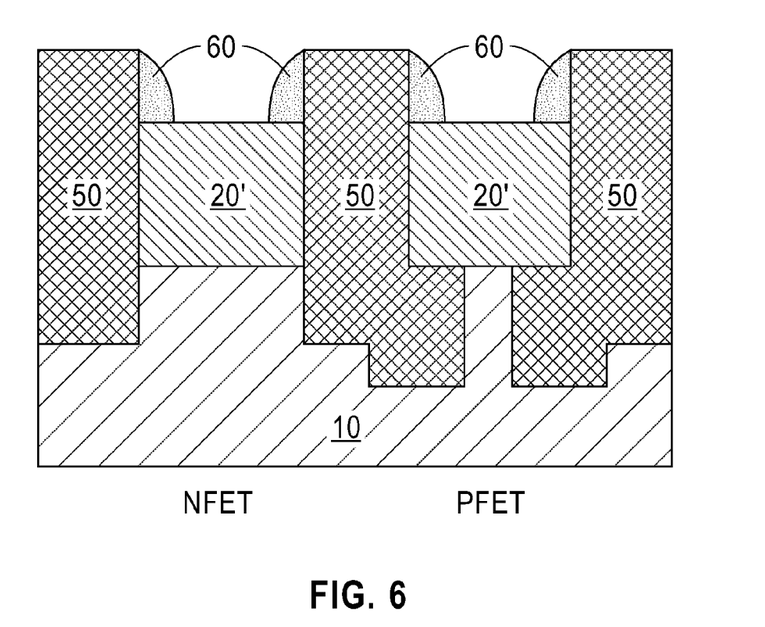
FIG. 6 depicts a cross-sectional view of the structure of FIG. 5 after the patterned hard mask layer has been removed and the inner spacers have been formed, in accordance with one embodiment of the present invention.

FIG. 6 depicts a cross-sectional view of the structure of FIG. 5 after patterned hard mask layer 30' has been removed and inner spacers 60 have been formed, in accordance with one embodiment of the present invention.

In one embodiment, after the planarization process resulting in the structure of FIG. 5, in which flowable oxide layer 50 has an uppermost surface that is substantially coplanar with the uppermost surface of patterned hard mask layer 30', the remaining portions of patterned hard mask layer 30' are removed. In one embodiment, a wet etch can be used to remove the remaining portions of patterned hard mask layer 30'. An example of a wet etch process that can be used to remove the remaining portions of the hard mask layer includes a diluted HF solution.

In one embodiment, after the remaining portions of patterned hard mask layer 30' are removed, inner spacers 60 are formed. For example, forming inner spacers 60 may include depositing a conformal layer (not shown) of insulating material, such as silicon nitride or silicon dioxide, over an uppermost surface of flowable oxide layer 50 and an uppermost surface of patterned strained semiconductor material layer 20', such that the thickness of the deposited layer on the sidewalls of flowable oxide layer 50, is substantially the same as the thickness of the deposited layer on the uppermost surface of flowable oxide layer 50 and the uppermost surface of patterned strained semiconductor material layer 20'. An anisotropic etch process, wherein the etch rate in the downward direction is greater than the etch rate in the lateral directions, may be used to remove portions of the deposited conformal layer, thereby forming inner spacers 60.

Figure 7:
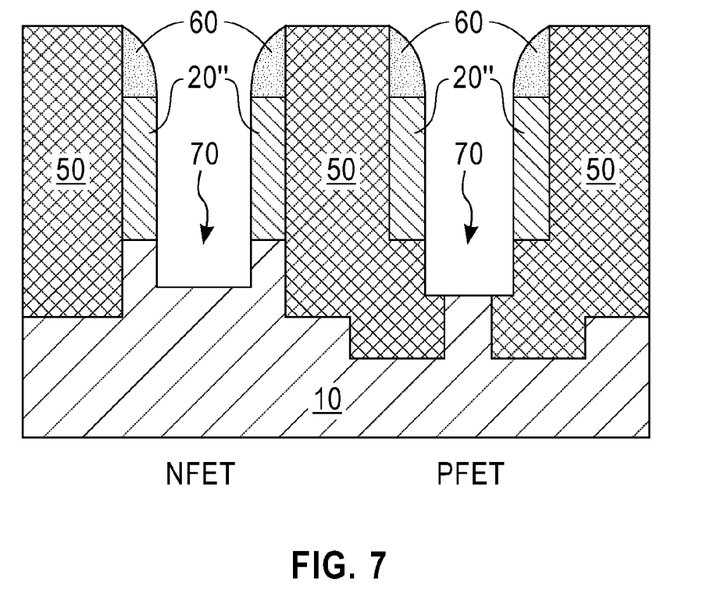
FIG. 7 depicts a cross-sectional view of the structure of FIG. 6 after portions of the patterned strained semiconductor material layer, left exposed after the forming of the inner spacers, have been etched through into the dielectric layer, in accordance with one embodiment of the present invention.

FIG. 7 depicts a cross-sectional view of the structure of FIG. 6 after portions of patterned strained semiconductor material layer 20' left exposed after the forming of inner spacers 60 have been etched through into dielectric layer 10, in accordance with one embodiment of the present invention.

In one embodiment, after the forming of inner spacers 60, inner spacers 60 can be used to protect portions of patterned strained semiconductor material layer 20' while leaving exposed other portions of patterned strained semiconductor material layer 20'. The exposed portions of patterned strained semiconductor material layer 20' are etched through into dielectric layer 10 in the areas designated as regions 70. The exposed portions of patterned strained semiconductor material layer 20' and dielectric layer 10 can be etched using a dry etch technique (e.g., plasma dry etching such as reactive ion etching (RIE) or the like or a non-plasma etching technique using, for example, fluorine-containing gas). In one embodiment, the etching process may stop about 15 nm down into dielectric layer 10. In other embodiments, the etching process may stop anywhere from 10 nm to 15 nm down into dielectric layer 10. The remaining portions of patterned strained semiconductor material layer 20' which are not removed during this step are designated in the drawings as remaining patterned strained semiconductor material layer 20". In one embodiment, each portion of remaining patterned strained semiconductor material layer 20" may be anywhere from 30 nm to about 50 nm, in width.

Figure 8:
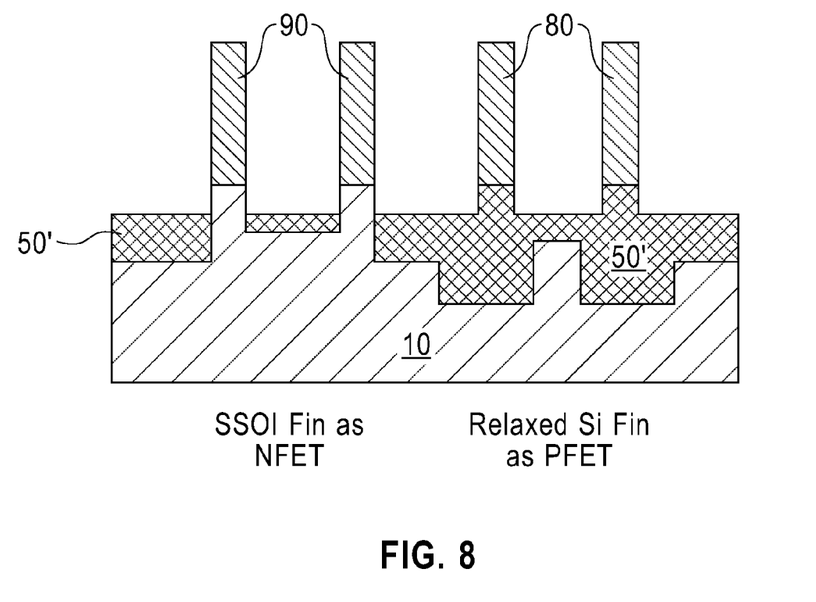
FIG. 8 depicts a cross-sectional view of the structure of FIG. 7 after fins have been formed, in accordance with one embodiment of the present invention.

FIG. 8 depicts a cross-sectional view of the structure of FIG. 7 after fins have been formed, in accordance with one embodiment of the present invention.

In one embodiment, more flowable oxide (not shown) is disposed in the trenches (e.g., regions 70 in FIG. 7) created by the etching of the exposed portions of patterned strained semiconductor material layer 20' through into dielectric layer 10. The flowable oxide is also deposited over the uppermost surface of the existing flowable oxide layer 50 and an uppermost surface of spacers 60. In one embodiment, flowable oxide can be any type of flowable oxide (e.g., $SiO_2$) that is capable of filling the trenches (e.g., regions 70 in FIG. 7) created by the etching of the exposed portions of patterned strained semiconductor material layer 20' through into dielectric layer 10. The flowable oxide can be deposited utilizing a deposition process such as, for example, chemical vapor deposition (CVD), plasma enhanced chemical vapor deposition (PECVD), evaporation, chemical solution deposition and spin-on coating.

In some embodiments, the flowable oxide is deposited to a height above the uppermost surface of the existing flowable oxide layer 50 (shown in FIG. 7). A planarization process is employed to reduce the height of the flowable oxide to the height of an uppermost surface of spacers 60 (shown in FIG. 7). The planarization process results in a structure in which the flowable oxide has an uppermost surface that is substantially coplanar with the uppermost surface of spacers 60. In one embodiment, the planarization process includes chemical mechanical polishing and/or grinding. In other embodiments, an etch back process can also be used.

In one embodiment, after the planarization process resulting in the flowable oxide having an uppermost surface that is substantially coplanar with the uppermost surface of spacers 60, spacers 60 are removed. In one embodiment, a wet etch can be used to remove spacers 60. An example of a wet etch process that can be used to remove the remaining portions of the hard mask layer includes a diluted HF solution.

In one embodiment, after spacers 60 have been removed, a planarization process is employed to reduce the height of the flowable oxide to the height of an uppermost surface of remaining patterned strained semiconductor material layer 20" (shown in FIG. 7). The planarization process results in a structure in which the flowable oxide has an uppermost surface that is substantially coplanar with the uppermost surface of remaining patterned strained semiconductor material layer 20". In one embodiment, the planarization process includes chemical mechanical polishing and/or grinding. In other embodiments, an etch back process can also be used.

In one embodiment, after the planarization process resulting in the flowable oxide having an uppermost surface that is substantially coplanar the uppermost surface of remaining patterned strained semiconductor material layer 20", the flowable oxide is recessed to form remaining flowable oxide layer 50' and to reveal nFET fins 90 and pFET fins 80. The flowable oxide may be recesses using an anisotropic etching process such as a dry etch technique (e.g., plasma dry etching such as reactive ion etching (RIE) or the like or a non-plasma etching technique using, for example, fluorine-containing gas). nFET fins 90 are formed from at least one fin, in the nFET region, formed in the process described in reference to FIG. 3. pFET fins 80 are formed from at least one fin, in the pFET region, formed in the process described in reference to FIG. 3.

In one embodiment, nFET fins 90 and pFET fins 80, once formed, have a width of about 4 nm to about 20 nm, with 6-10 nm preferred, and a height of about 20 nm to about 100 nm, which 30 nm to about 70 nm preferred. The length of the fins could range from about 100 nm to a few microns. However, the gate-pitch could be 40 nm to 500 nm. In the pFET area, pFET fins 80 are relaxed because the original interface between dielectric layer 10 and portions of patterned strained semiconductor material layer 20' in pFET regions were removed during the lateral etch discussed above. In the nFET area, nFET fins 90 are strained because the original interface between dielectric layer 10 and portions of patterned strained semiconductor material layer 20' in pFET regions were not removed during the lateral etch discussed above.

What is claimed is:

1. A semiconductor device, comprising:
a strained silicon on insulator (SSOI) structure, wherein the SSOI structure comprises at least a substrate, a dielectric layer disposed on the substrate, and a strained semiconductor material layer disposed on the dielectric layer;
a first plurality of fins in an nFET region of the SSOI structure, wherein each fin of the first plurality of fins comprises a portion of the strained semiconductor material layer disposed on the dielectric layer; and
a second plurality of fins in a pFET region of the SSOI structure such that each fin of the second plurality of fins comprises a portion of the strained semiconductor material layer disposed on a flowable oxide.

2. The semiconductor device of claim 1, wherein the dielectric layer comprises a buried oxide (BOX).

3. The semiconductor device of claim 1, wherein the dielectric layer comprises silicon dioxide.

4. The semiconductor device of claim 1, wherein the substrate comprises one or more of the following: silicon; germanium; silicon germanium; silicon carbide; type III-V compound semiconductors; type II-VI compound semiconductors; and combinations and multi-layers thereof.

5. The semiconductor device of claim 1, wherein the strained semiconductor material layer has a thickness in a range of 50 nm to 100 nm.

6. The semiconductor device of claim 1, wherein each fin of the first plurality of fins has a width in a range of 4 nm to 20 nm.

7. The semiconductor device of claim 1, wherein each fin of the first plurality of fins has a width in a range of 6 nm to 10 nm.

8. The semiconductor device of claim 1, wherein each fin of the second plurality of fins has a width in a range of 4 nm to 20 nm.

9. The semiconductor device of claim 1, wherein each fin of the second plurality of fins has a width in a range of 6 nm to 10 nm.

10. The semiconductor device of claim 1, wherein the flowable oxide comprises silicon dioxide.

11. The semiconductor device of claim 1, wherein each fin of the first plurality of fins has a height in a range of 20 nm to 100 nm.

12. The semiconductor device of claim 1, wherein each fin of the first plurality of fins has a height in a range of 30 nm to 70 nm.

13. The semiconductor device of claim 1, wherein each fin of the second plurality of fins has a height in a range of 20 nm to 100 nm.

14. The semiconductor device of claim 1, wherein each fin of the second plurality of fins has a height in a range of 30 nm to 70 nm.

15. The semiconductor device of claim 1, wherein the first plurality of fins in the nFET region are strained because of an interface between the portion of the strained semiconductor material layer disposed on the dielectric layer.

16. The semiconductor device of claim 1, wherein the second plurality of fins in the pFET region are relaxed.

* * * * *